(12) United States Patent
Lee et al.

(10) Patent No.: US 10,659,580 B2
(45) Date of Patent: May 19, 2020

(54) CONNECTING SLED SYSTEM FOR MOBILE DEVICES

(71) Applicant: AI Solution Co., Ltd., Seoul (KR)

(72) Inventors: Hanjin Lee, Chungcheongnam-do (KR); Byeonsoo Yoo, Chungcheongnam-do (KR); Joonhee Lim, Chungcheongnam-do (KR)

(*) Notice: Subject to any disclaimer, the term of this patent is extended or adjusted under 35 U.S.C. 154(b) by 0 days.

(21) Appl. No.: 16/424,847

(22) Filed: May 29, 2019

(65) Prior Publication Data
US 2020/0128118 A1 Apr. 23, 2020

(30) Foreign Application Priority Data

Oct. 18, 2018 (KR) .................. 10-2018-0124726

(51) Int. Cl.
| | |
|---|---|
| *H04M 1/04* | (2006.01) |
| *H04M 1/02* | (2006.01) |
| *H05K 5/02* | (2006.01) |
| *H05K 5/00* | (2006.01) |
| *G06F 1/16* | (2006.01) |

(52) U.S. Cl.
CPC ........ *H04M 1/0262* (2013.01); *G06F 1/1632* (2013.01); *H05K 5/0026* (2013.01); *H05K 5/0278* (2013.01)

(58) Field of Classification Search
CPC ...... H04M 1/185; H04M 1/026; H04M 1/165; H04M 1/04; H04M 1/1628; H05K 5/026; H05K 5/0278; G06F 1/1632; G06F 1/1648; G06F 1/185; H01M 1/0262
See application file for complete search history.

(56) References Cited

U.S. PATENT DOCUMENTS

| | | | |
|---|---|---|---|
| 8,832,323 B2 | 9/2014 | Lee | |
| 2013/0297844 A1* | 11/2013 | Rosenberg | ............ G06F 1/1632 710/303 |
| 2017/0274671 A1* | 9/2017 | Zhang | ............... G06F 1/1632 |
| 2018/0307879 A1* | 10/2018 | Skali | ..................... H04M 1/185 |
| 2019/0101956 A1* | 4/2019 | Unnikrishnan | ....... G06F 1/1684 |

FOREIGN PATENT DOCUMENTS

| | | |
|---|---|---|
| KR | 10-2008-0056336 A | 6/2008 |
| KR | 10-1136941 B | 4/2012 |
| KR | 10-1383407 B | 4/2014 |

* cited by examiner

*Primary Examiner* — Thanh C Le
(74) *Attorney, Agent, or Firm* — Law Offices of Albert Wai-Kit Chan, PLLC

(57) ABSTRACT

The present invention relates to a sled system for physically attaching a mobile device and a peripheral device and electrically connecting both. A modular sled system according to the present invention comprises a mount unit to physically attach a peripheral device to a mobile device and the mount unit comprises an electrical connection part to be electrically connected to each of the peripheral device and the mobile device.

13 Claims, 11 Drawing Sheets

# CONNECTING SLED SYSTEM FOR MOBILE DEVICES

CROSS-REFERENCE TO RELATED APPLICATION

This application claims the benefit of Korean Patent Application No. 10-2018-0124726, filed on Oct. 18, 2018, the disclosure of which is hereby incorporated herein by reference in its entirety.

BACKGROUND OF THE INVENTION

1. Field of the Invention

The present invention relates to a sled system for physically attaching a mobile device and peripheral device and electrically connecting both.

2. Description of the Related Art

Mobile terminals such as mobile phones, smart phones and/or PDAs have been widely used for more than simple communication devices or media apparatuses. Many applications have been used to expand the functions of a mobile terminal in order to attain additional purposes by using a peripheral device which is connectable to the mobile terminal for a particular purpose.

However, both an electronic connection and a physical attachment are required in connecting a peripheral device to a mobile terminal. In this regard, since mobile terminals have different operating environments (system, OS) and further since mobile terminals are apparently different in size or shape, etc., it is somewhat difficult to secure mobile terminals having different shapes to a peripheral device.

Especially, in order to use a mobile terminal by connecting it to a peripheral device, an attachment unit is required to attach a mobile terminal to a peripheral device for their physical attachment. Further, since mobile terminals have different shapes, it is difficult to supply each attachment unit which is suitable to a particular mobile terminal, to attach the particular mobile terminal to the peripheral device. Even if a universal attachment unit is produced, since it needs to be adjustable to fit the appearance such as the size or shape of a mobile terminal, it becomes structurally complicated.

Further, not only a physical attachment but also an electronic connection is required between a peripheral device and a mobile terminal. Although a peripheral device and a mobile terminal can be connected through a wireless connection mode such as Bluetooth protocol, etc., only the connection through the wireless connection mode has a limit in maintaining the power source of the mobile terminal connected to the peripheral device.

That is, to use a peripheral device and a mobile terminal, an external power supply needs to be directly connected to the peripheral device and the mobile terminal, or electric energy needs to be continuously maintained. To charge a peripheral device and a mobile terminal at once, it is inconvenient to connect a power source to the peripheral device and the mobile terminal. Even if a special charge part receiving external power is provided in a single body to a peripheral device in order to charge a mobile device, it is difficult to provide a universal charging terminal corresponding to every mobile terminal shape.

For example, a smart phone using the Android OS, which is sold in the market, provides the USB OTG (On-The-Go) function to receive/send data from/to a peripheral device. When the Android smart phone providing this function is attached and connected to a peripheral device such as a bar code scanner, the peripheral device operating as a USB host operates as a USB client, enabling data communication between the smart phone and the peripheral device. However, when the smart phone operates as the USB host, the smart phone cannot be charged.

Further, since mobile terminals are different in size by products and therefore, the position (height) of a charging terminal provided to a mobile terminal may be different, it is very difficult to attach the charging terminal to the peripheral device. To this end, when a position correction is performed with respect to the position of the charging terminal by using a charging cable, since the charging cable is exposed, it detracts from its appearance. Even if the charging cable is positioned inside the peripheral device, since the charging cable having a certain length moves as the position adjustment operation of the charging cable is repetitively performed, a risk of breaking the charging cable exists.

RELATED ART DOCUMENT

Korean Patent Publication 10-1383407 B1

SUMMARY OF THE INVENTION

The present invention relates to a modular sled system for physically attaching a mobile device to a peripheral device and electrically connecting both. In particular, it is an object of the present invention to solve the above problems and to provide a modular sled system for providing physical and electronic modes to easily and conveniently operatively connect a mobile terminal and peripheral devices including a bar code reader and a magnetic card reader.

It is another object of the present invention to provide a system for charging a mobile device when the mobile device is attached and connected to a peripheral device.

In accordance with an embodiment of the present invention, there is provided a modular sled system for physically attaching a mobile device and a peripheral device and electrically connecting both, which comprises: a mount unit to physically attach the peripheral device to the mobile device, wherein the mount unit comprises an electrical connection part to be electrically connected in use to each of the peripheral device and the mobile device.

The electrical connection part of the mount unit comprises: a connection circuit board, a first connector part to be connected to the peripheral device and a second connector part to be connected to the mobile device, and the first connector part and the second connector part are positioned oppositely on the connection circuit board to simultaneously connect the peripheral device and the mobile device, respectively.

The first connector part comprises: a contact terminal to be in contact with the peripheral device, the second connector part comprises a connector plug with a connector head to be inserted in a connection port of the mobile device and a connector housing to receive the connector plug, and the connector plug is attachably/detachably mounted on the connector housing by magnetic force such that the connector head is replaceable with a connector head having a different shape in response to the mobile device.

The connector housing of the second connector part is mounted on the connection circuit board, so as to be movable up/down to the height of the connection port of the mobile phone.

The second connector part further comprises a connection cable to be movable in response to the up/down movement of the connector housing, to maintain the connection between the connection circuit board and the connector housing.

The electrical connection part further comprises a power supply part to supply power from the outside to the peripheral device and the mobile device.

The power supply part is selected from a group of a wireless charging module, a charging cradle pin, an auxiliary battery terminal and a USB connection terminal.

The peripheral device is selected a group of a small bar code reader, a magnetic strip reader (MSR), an integrated circuit (IC) card reader, a peripheral device trigger and a RFID tag reader.

The modular sled system further comprises: a control unit which operates in a USB client mode or a USB host mode when the mobile device is mounted on the modular sled system.

When the mobile device is not mounted on the modular sled system, the control unit operates the modular sled system in the USB client mode and when the mobile device is mounted, the control unit operates the modular sled system in the USB host mode.

When the mobile device is mounted on the modular sled system, the modular sled system operates in the USB host mode and the mobile device operates in the USB client mode, to charge the mobile device, and when the mobile device is in the process of being charged, the modular sled system communicates with the mobile device through Bluetooth communication.

When charging the mobile device is completed, the modular sled system is changed to the USB client mode so that the mobile device operates in the USB host mode.

Advantageous Effect

According to the present invention, the sled system for physically attaching a mobile device and a peripheral device and electrically connecting both (hereinafter, referred to as the "sled system" or "modular sled system") is provided such that the user can easily attach the peripheral device to the mobile device for use. To this end, the sled system comprises a mount unit to be attached to each of the peripheral device and the protection case of the mobile device. Since the screw-fastening method is used for the attachment structure between the peripheral device and the mount unit and the attachment structure between the mount unit and the protection case, these constituents are firmly held. When these constituents need to be dissembled or separated, they are released from being held by simply loosening the screws. Therefore, the attachment and separation work is easily accomplished.

Especially, since the peripheral device is attached to the mount unit which is attached to the protection case, if any mobile device fits a general protection case, the mobile device is attached to the peripheral device, without any limitation to the particular mobile device, regardless of the size or shape of the mobile device. Therefore, the compatibility is great.

That is, even if a special case which fits a certain mobile device having a different shape is not provided to hold the mobile device, the attachment of the mount unit and the peripheral device is possible by only forming, in an ordinary protection case, the through hole to be aligned to the mobile device attachment part of the mount unit. In this point, the mobile device is simply held without preparing any holding unit which differently operates according to the different size of the mobile device to be used. Therefore, since it is not complicated structurally, the manufacturing cost is reduced and since the manufacturing and connecting work is simple, a working time is shortened.

The mount unit comprises the electrical connection part to be electrically connected to the mobile device and the peripheral device, allowing a wired connection of the mobile device and the peripheral device. Since the wired connection with the mobile device is made by the magnetic method, the connection structure is replaceable. Since it is possible to selectively use any connector plug, regardless of the type of the connection port of the mobile device, the compatibility with the mobile device is considerably improved.

Further, the mount unit comprises the connector housing which is movable up/down to be connected to the connection port which is positioned at a different height based on the appearance size of the mobile device, so as to be compatible with the mobile device in a different size or shape. Therefore, even if the position of the connector plug to be inserted into the connection port is different in height, since the connector housing is sufficiently available, the compatibility with the mobile device is considerably improved.

For the power supply of the peripheral device and the mobile device, the sled system may comprise each module which enables power charge by an external supply through a separate charging cradle, power supply and charge by using an external auxiliary battery or wireless charge by a wireless charging module. Since the peripheral device and the mobile device are electrically connected by the electrical connection part of the mount unit, the sled system has the structural advantage that power is supplied to both of the peripheral device and the mobile device by only a single external connection.

Further, since the sled system by itself supports the USB host mode and the USB client mode, it is possible to be connected to all Android smart phones which support only the USB client mode as well as the PCs which support only the USB host mode. Further, as the Android smart phone is connected in the client mode, communicating with the Android smart phone is possible with charging the smart phone simultaneously.

BRIEF DESCRIPTION OF THE DRAWINGS

The above and other features and advantages of the present invention will become more apparent to those of ordinary skill in the art by describing in detail the preferred embodiment(s) thereof with reference to the attached drawings in which.

Figure 1A:
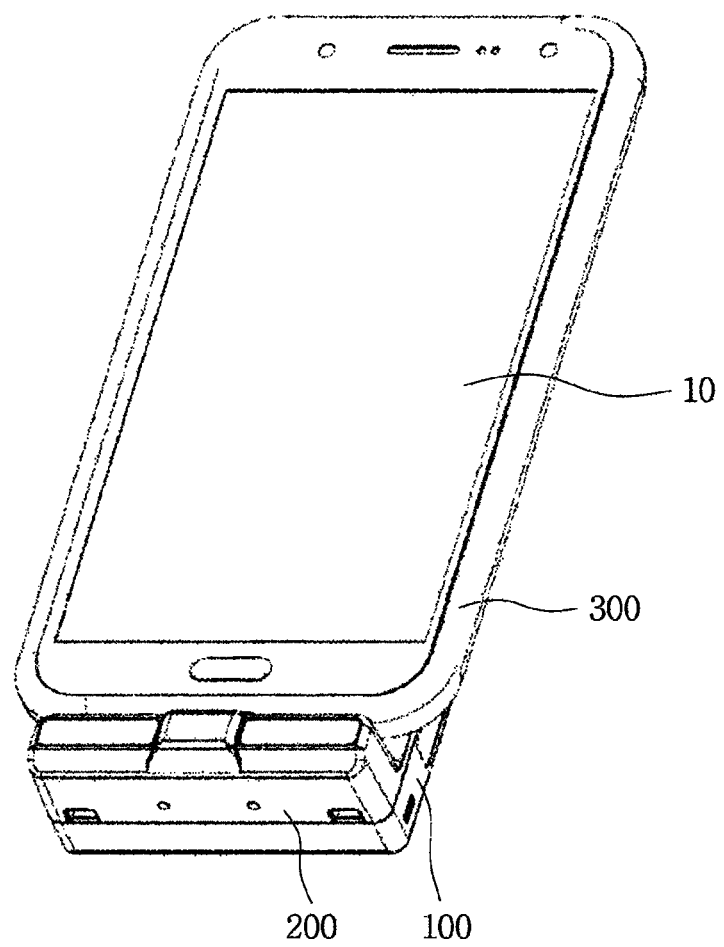
FIG. 1A and FIG. 1B are perspective views of the constitution of a sled system for physically attaching a mobile device and a peripheral device and electrically connecting both according to the present invention.

DESCRIPTION OF NUMBERS FOR
CONSTITUENTS IN DRAWINGS

10: mobile device
100: peripheral device
200: mount unit
210: peripheral device attachment part
220: mobile device attachment part
230: electrical connection part
300: protection case

DETAILED DESCRIPTION OF THE
PREFERRED EMBODIMENT

The present invention will now be described more fully hereinafter with reference to the accompanying drawings, in which the preferred embodiment(s) of the invention is shown so that those of ordinary skill in the art can easily carry out the present invention.

The advantages and characteristics of the present invention and the way(s) to achieve them will become apparent from the following description of the embodiment(s) with reference to the accompanying drawings. This invention may, however, be embodied in many alternate forms and should not be construed as limited to only the embodiment(s) set forth herein.

The embodiments are provided so that this disclosure will be complete and will fully convey the scope of the invention to those skilled in the art. This invention is defined by the scope of the claim(s). Therefore, well-known constituent elements, operations and techniques are not described in detail in the embodiment(s), to prevent the present invention from being obscurely interpreted.

Like numbers refer to like elements having like functions and actions throughout the specification and drawings. The terms used herein are for the purpose of describing the embodiment(s) only and are not intended to limit the invention. As used herein, the singular forms are intended to include the plural forms as well, unless the context clearly indicates otherwise. The terms "comprises", "comprising", "includes" and/or "including", when used herein, specify the presence of stated components, operations and/or steps but do not precluded the presence or addition of one or more other components, operations, steps and/or groups thereof.

Unless otherwise defined, all terms (including technical and scientific terms) used herein have the same meaning as commonly understood by one having ordinary knowledge in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the technical characteristics of the present invention will be specifically described with reference to the accompanying drawings.

Figure 1B:
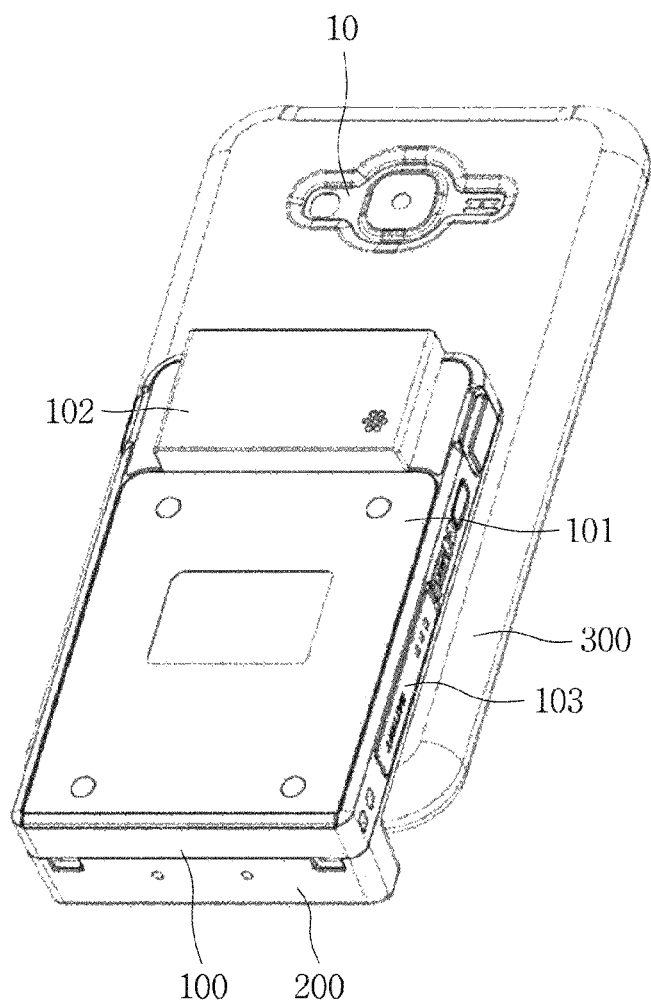
Figure 2:
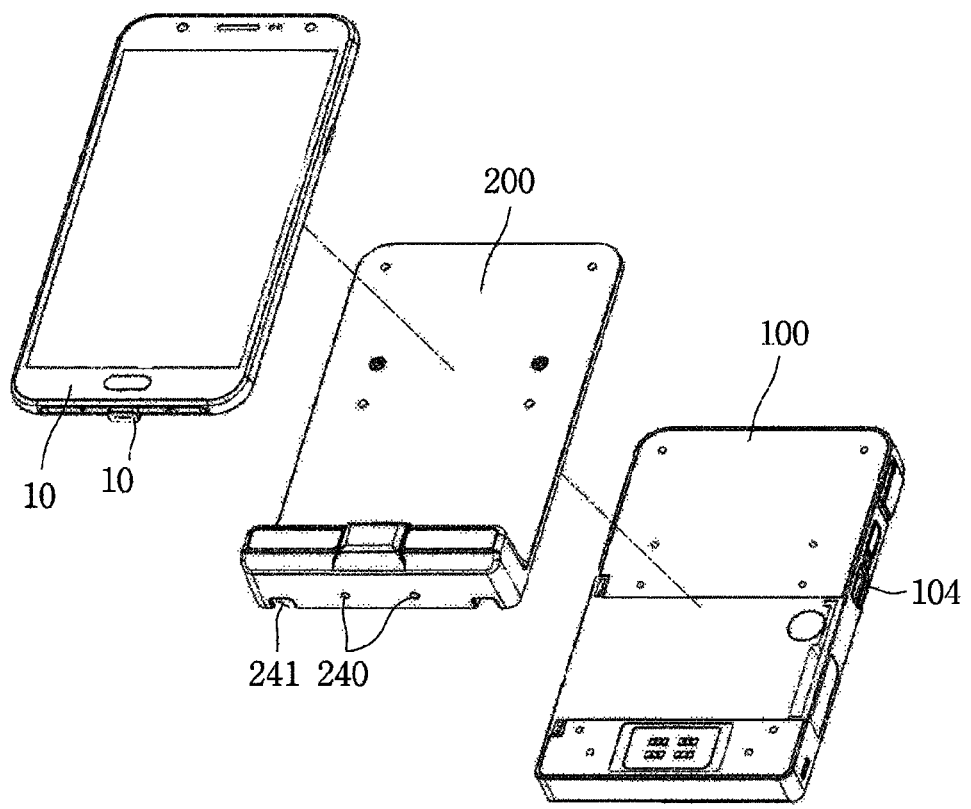
FIG. 2 is an exploded schematic perspective view of the sled system.

FIG. 1A, FIG. 1B and FIG. 2 show the entire constitution of a sled system for physically attaching a mobile device and a peripheral device and electrically connecting both according to the present invention (hereinafter, referred to as the "sled system"). FIG. 1A is a front perspective view of the sled system, FIG. 1B is a rear perspective view thereof and FIG. 2 is an exploded perspective view of the sled system shown in FIG. 1A.

In FIG. 1A and FIG. 1B, the sled system comprises: a peripheral device 100 to be attached to a mobile device 10, and a mount unit 200 to attach the peripheral device 100 and the mobile device 10. That is, the peripheral device 100 is physically attached or connected to the mobile device 10 through the mount unit 200. the electrical connection is provided between the devices as described below:

The peripheral device 100 may be at least one of the peripheral devices of any shape, including a portable bar code reader, a magnetic strip reader (MSR), a charging dock, an integrated circuit (IC) card reader, a peripheral device trigger, a radio-frequency identification (RFID) tag reader, a biometric verification module and a multi-threat monitor. For example, FIG. 1A and FIG. 1B illustrate a portable bar code reader. It is obvious to one skilled in the art that various modifications, changes, additions and substitutions are possible from this application. Usually, a product selected from a group including a mobile phone, a smart phone, a PDA, etc. may be used as the mobile device 10.

In any case, the mobile device 10 is connected to the peripheral device 100 in the sled system according to the present invention, by a wire mode or a protocol such as the Bluetooth protocol.

The sled system has the interoperability since the peripheral device 100 is physically attached and electrically connected to the mobile device 10. FIG. 2 shows the state that the constituents of the sled system are separated. In FIG. 2, the mount unit 200 is attached to the peripheral device 100 and the mobile device 10 is attached to the mount unit 200 so that the mobile device 10 and the peripheral device 100 are attached together.

Figure 3:
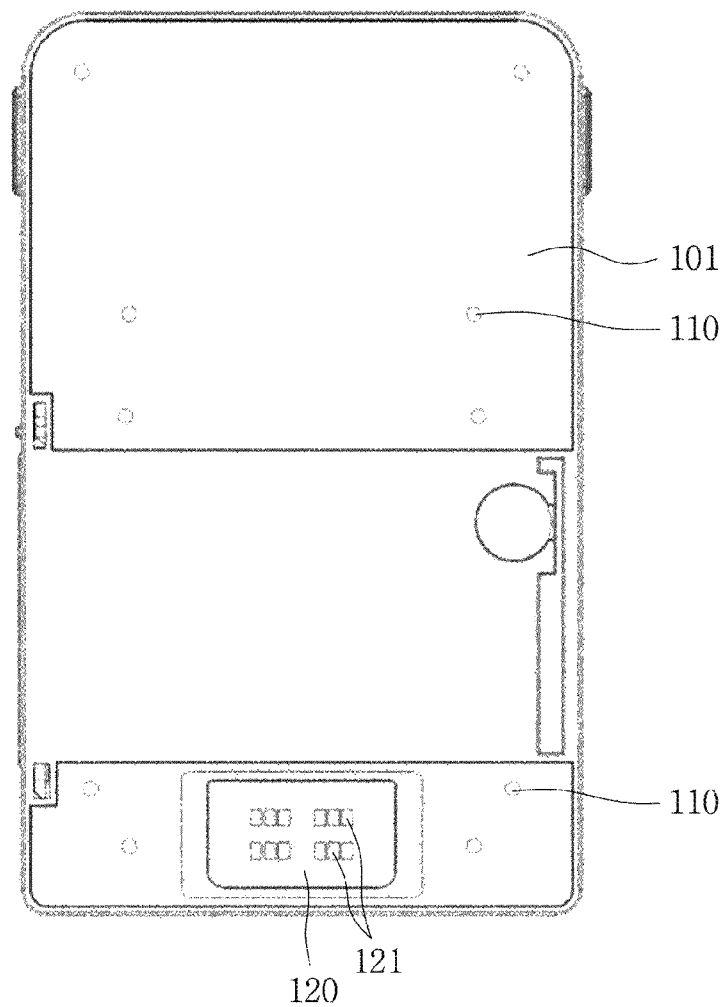
FIG. 3 is a front view of a peripheral device of the sled system.

FIG. 3 schematically shows the front of the peripheral device 100 according to one embodiment of the sled system. The peripheral device 100 will be described with reference to FIG. 1A, FIG. 1B, FIG. 2 and FIG. 3. As shown, the peripheral device 100 is, for example, a bar code reader. The peripheral device 100 includes a main body 101, a bar code scan part 102 to operate the bar code reader, a battery part 103 to supply a power source, a USB external connection part 104 and a control unit (not shown) positioned inside the main body 101 to control the operation of the sled system. The mount unit 200 is detachably secured to one side (front) of the peripheral device 100.

The peripheral device 100 includes a fastening part 110 formed on one side which contacts the mount unit 200, for the attachment to the mount unit 200. The fastening part 110 of the peripheral device 100 may be in the shape of a screw-groove or in the structure of attaching the peripheral device 100 to the mount unit 200 by using a fastening member like a screw(s) (not shown) so that the peripheral device 100 is secured to the mount unit 200. The fastening part 110 may comprise at least two (2) screw grooves and comprises four (4) screw grooves in the embodiment of the present invention, to be attached to the mount unit 200. The fastening part 110 may be variously structured by using at least one of the attachment structures to physically hold the peripheral device to the mount unit 200, that is, a button-type snap fastener, an elastically inserting and removing method to be detachably locked and secured, and a hook and loop fastener.

The peripheral device 100 further includes a contact part 120 to be electrically connected to a first connector part 233 of the mount unit 200 to be described later. The contact part 120 is formed at a lower position of the front of the main body 101 and includes a plurality of contact terminals 121 to be in contact with the first connector part 233. The electrical connection state between the peripheral device 100 and the mobile device 10 is maintained when the contact part 120 is in contact with and connected to the first connector part 233 through the contact terminals 121.

Figure 4A:
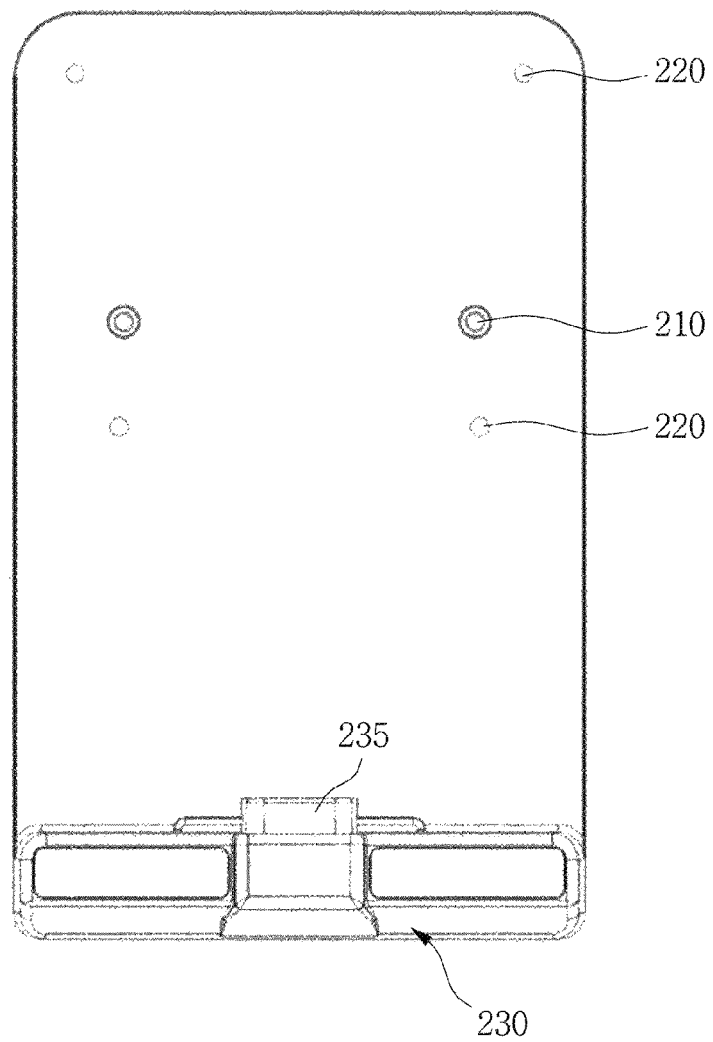
FIG. 4A and FIG. 4B are respectively a front view and a rear view of a mount unit of the sled system.
Figure 4B:
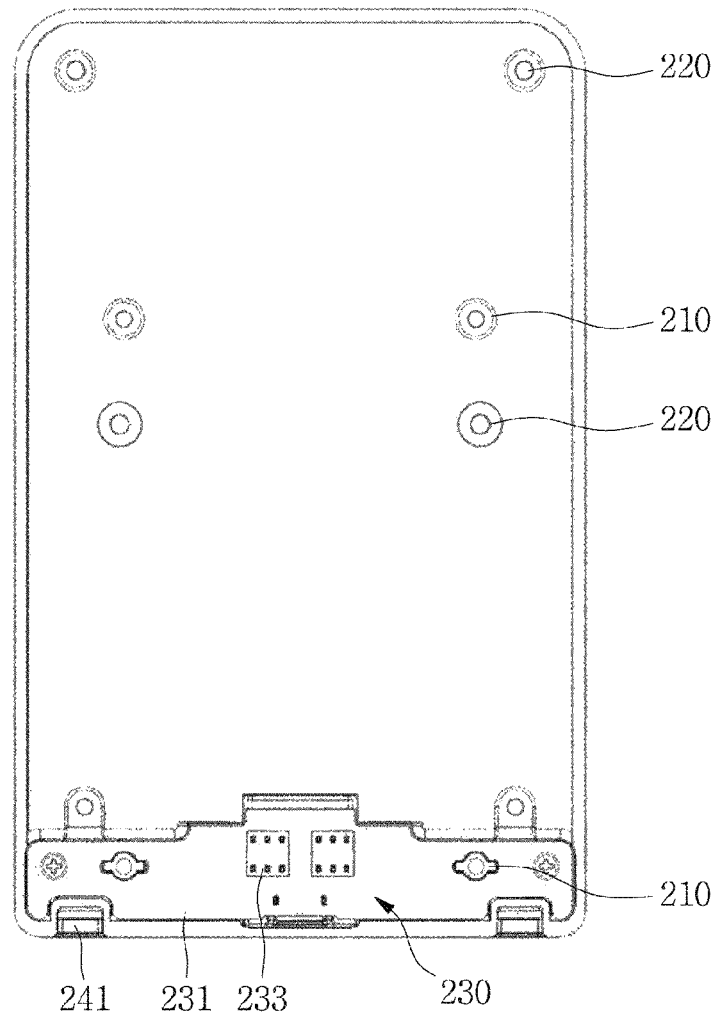

FIG. 4A and FIG. 4B schematically illustrate the front (a) and the back (b) of the mount unit 200 in the sled system according to the embodiment of the present invention. The mount unit 200 will be described with reference to FIG. 4A and FIG. 4B. The mount unit 200 is to secure the mobile device 10 which is mounted on the front side of the mount unit 200, to the peripheral device 100. The mount unit 200 includes a peripheral device attachment part 210 to be attached to the peripheral device 100.

According to the embodiment of the present invention, since the mount unit 200 is structured to be attached to the peripheral device 100 by fastening screws, the peripheral device attachment part 210 is formed in the shape of a screw hole through which the fastening member is inserted to be aligned with the fastening part 110 of the peripheral device 100. The fastening member is fastened in the fastening part 110 of the peripheral device 100 through the peripheral device attachment part 210, so that the mount unit 200 is attached to the peripheral device 100. When the fastening part 110 of the peripheral device 100 is formed by a method other than the screw-fastening method, it is desirable to form the peripheral device attachment part 210 in a different structure according to such a connection mode.

The mobile device 10 is attached to the other side of the mount unit 200 and thus the mount unit 200 further includes a mobile device attachment part 220. The mobile device attachment part 220 may use different securing methods to hold the mobile device 10. In the embodiment of the present invention, the mobile device attachment part 220 is structured to secure the mobile device 10 to the sled system by securing a usual protection case of the mobile device 10.

Figure 5:
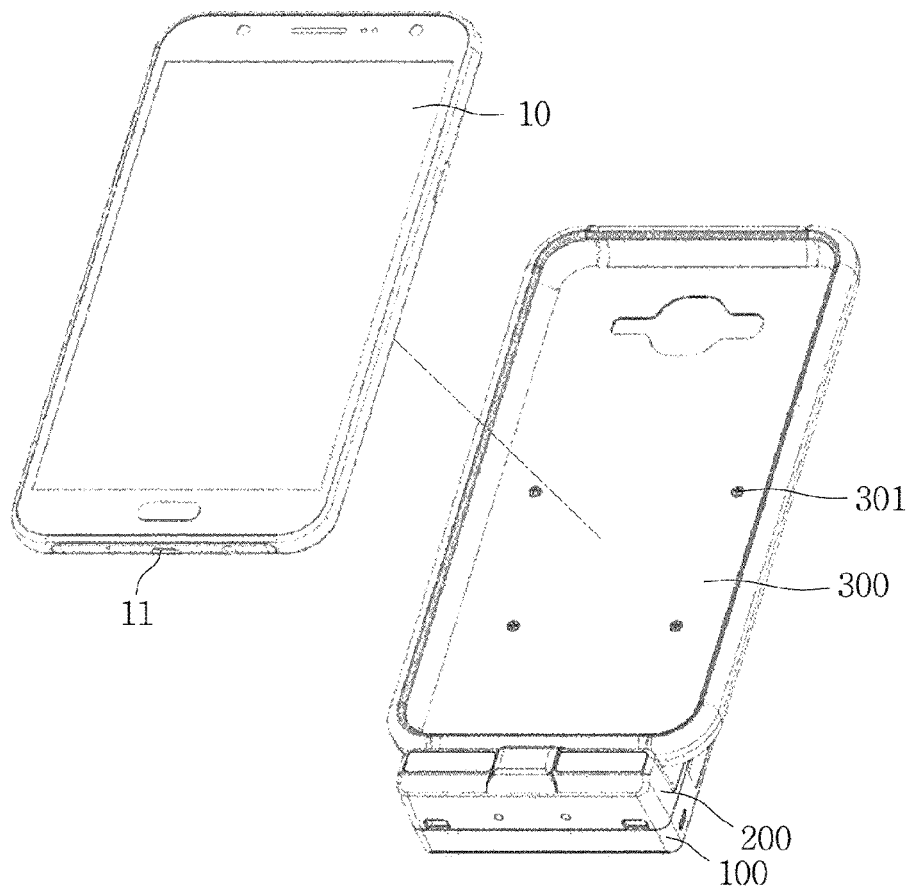
FIG. 5 is a perspective view of a mobile device which is mounted on a protection case of the sled system.

To this end, the sled system according to the embodiment of the present invention may further comprise a protection case 300 to protect the mobile device 10 as shown in FIG. 1A, FIG. 1B and FIG. 5. Preferably, the mount unit 200 comprises the mobile device attachment part 220 to secure the protection case 300.

The mobile device attachment part 220 of the mount unit 200 is provided by the screw-fastening method like the peripheral device attachment part 210 described above. Preferably, the protection case 300 includes a through hole is formed to be aligned to the mobile device attachment part 220. The protection case 300 is mounted on the mount unit 200 by using a fastening member 301 to be attached to the mobile device attachment part 220 through the through hole.

It will be understood that obviously one skilled in the art may use any of different physical connection methods as the method to mount the protection case 300 on the mount unit 200, that is, to mount the mobile device 10 on the mount unit 200.

The mobile device 10 is mounted on the mount unit 200 by being inserted in the protection case 300 of the present invention, like a smart phone case. The mobile device 10 is attached to the mount unit 200 by securely attaching the protection case 300 to the mount unit 200.

In other words, to mount the mobile device 10 on the mount unit 200, the sled system according to the present invention provides a structure that the protection case 300 is secured to the mount unit 200 by forming a through hole(s) for fastening in the protection case 300 which is widely used and by simply fastening a screw(s). Accordingly, even though the mobile device 10 in a different shape and type is used, it is attached to the peripheral device 100 by forming only the through hole(s) in the protection case 300, so as to be aligned to the mobile device attachment part(s) 220 of the mount unit 200.

Especially, since the sled system provides the structure of attaching the peripheral device 100 and the mobile device (10) by using the mount unit 200, rather than the structure of directly securing the mobile device 10 to the peripheral device 100, even if the peripheral device 100 has another form, such as an IC card reader among others, instead of the bar code reader, the mobile device 10 is attached to the peripheral device 100 as it is mounted on the mount unit 200. Therefore, it is easy to attach the mobile device 10 to the peripheral device 100, regardless of the shape and size of the mobile device 10.

The mount unit 200 includes an electrical connection part 230 in addition to the physical attachment to the peripheral device 100 and the mobile device 10. The electrical connection part 230 of the mount unit 200 is electrically connected to the peripheral device 100 and the mobile device 10, respectively.

Figure 6:
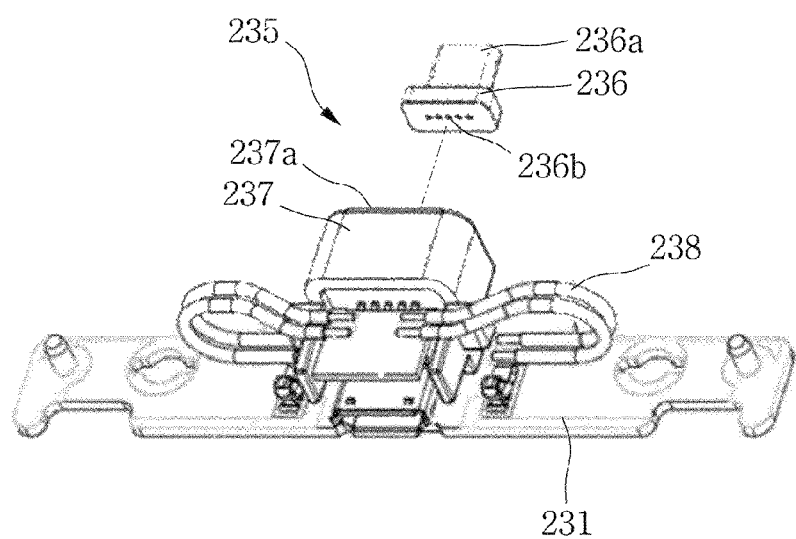
FIG. 6 is a perspective view of an electrical connection part of the system.

FIG. 6 shows the electrical connection part 230 of the mount unit 200. In FIG. 4A, FIG. 4B and FIG. 6, the electrical connection part 230 includes, at its lower position, a connection circuit board 231, a first connector part 233 and a second connector part 235 which are respectively connected to the peripheral device 100 and the mobile device 10.

The first connector part 233 is connected to the peripheral device 100. As shown in FIG. 4B, the first connector part 233 is positioned at the back side of the connection circuit board 231. The first connector part 233 includes a plurality of contact terminals to be in contact with and connected to the contact part 120 of the peripheral device 100 connected to the mount unit 200. The first connector part 233 is connected to the contact part 120 of the peripheral device 100, to maintain the electrical connection state with the peripheral device 100. That is, the first connector part 233 is positioned at the back side of the mount unit 200 and is connected to the peripheral device 100 by contacting the contact part 120.

The second connector part 235 to be connected to the mobile device 10 is positioned at the front side of the connection circuit board 231, to be connected to a connection port 11 of the mobile device 10.

The first connector part 233 of the mount unit 200 is connected to the peripheral device 100 and the second connector part 235 is connected to the mobile device 10. Each of the connector parts is electrically connected at the connection circuit board 231, enabling the connection of the peripheral device 100 and the mobile device 10.

In the sled system, the second connector part 235 is inserted into the connection port 11, to be electrically connected to the mobile device 10. In the preferred embodiment of the present invention, the second connector part 235 is structured such that a connector is removable to be replaced according to the shape of the connection port 11 of the mobile device 10 as used, to fit the connection port 11 in a different shape.

As shown, the second connector part 235 comprises a connector plug 236 to be inserted into the connection port 11 of the mobile device 10, and a connector housing 237 receiving the connector plug 236 which is removable.

The connector plug 236 includes a connector head 236a to be inserted into the connection port 11 of the mobile device 10, and a plurality of pins 236b formed to electrically connect the connector plug 236 to the connection circuit board 231.

The connector housing 237 is positioned at the connection circuit board 231, so as to be electrically connected. A receiving part 237a to receive the connector plug 236 has one open side. Pins to be connected to the pins 236b of the connector plug 236 are positioned inside the open side of the receiving part 237a.

The second connector part 235 includes a magnet on the side where the connector plug 236 and the connector housing 237 are in contact with each other, leading the connector plug 236 to be removably inserted into the receiving part 237a by magnetic force. Since the connector head 236a of the connector plug 236, which is inserted into the connection port 11, is received in the receiving part 237a of the connector housing 237, the second connector part 235 is electrically connected to the mobile device 10. Since the second connector part 235 is provided with the connector to be attached or detached by magnetic force, the second connector part 235 and the mobile device 10 are connected to each other only by inserting the mobile device 10 in the protection case 300 fastened to the mount unit 200.

Especially, the connector head 236a of the connector plug 236 is replaceable according to types, that is, micro 5 pin, micro 8 pin or C-type, etc., to be replaced with a head which fits the particular device.

Generally, the connection port of the mobile device is positioned at a bottom end of the mobile device. However, a height in the position of the connection port may be different, based on the thickness of the mobile device.

Accordingly, in the second connector part 235 of the present invention, preferably the position of the connector housing 237 is adjustable to fit a different height of the connection port 11 of the mobile device 10.

To this end, in the sled system of the present invention, the second connector part 235 is structured such that the connector housing 237 is movable upward/downward on the connection circuit board 231, and the second connector part 235 further comprises a connection cable 238 to maintain the state of connecting the connector housing 237 which is movable upward/downward and the connection circuit board 231.

Figure 7:
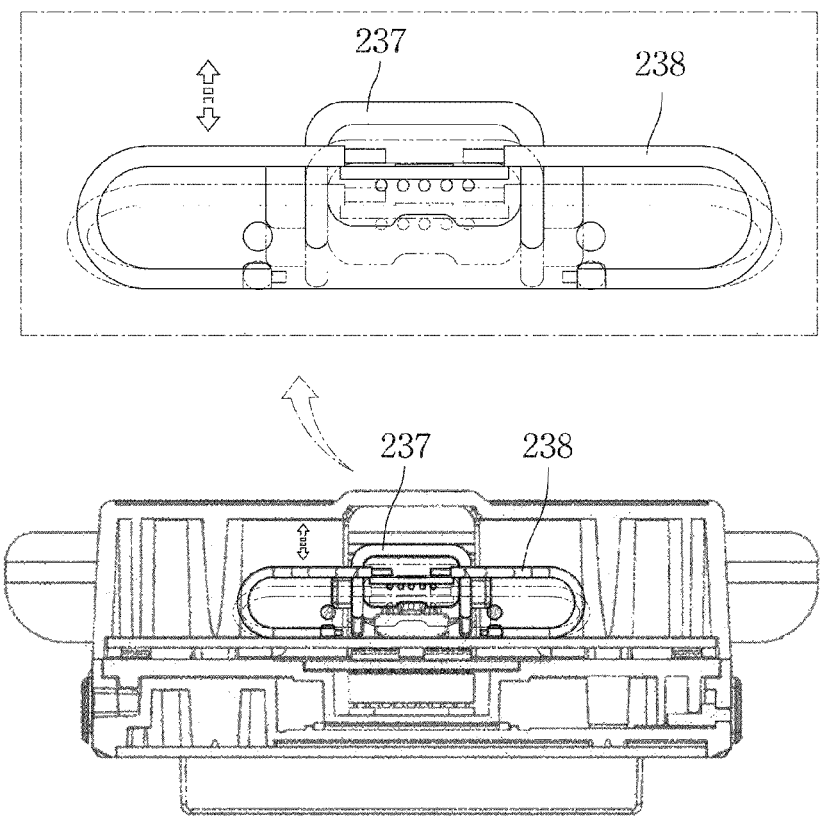
FIG. 7 is a cross-sectional view of the electrical connection part of system.

As shown in FIG. 7, the second connector part 235 may include an elastic member (not shown) under the connector housing 237 so as to elastically support the connector housing 237 which moves upward/downward, or a guide rail (not shown) vertically formed so that the connector housing 237 moves upward/downward along the guide rail.

Further, one end of the connection cable 238 is connected to the connector housing 237 and the other end thereof is connected to the connection circuit board 231, enabling to electrically connect the mobile device 10 and the connection circuit board 231. The connection cable 238 has a predetermined length and is bendable or movable such that the length is adjustable when the connector housing 237 moves upward/downward, based on the up/down movement of the connector housing 237.

As described above, the mount unit 200 of the present invention has the structure of securing the mobile device 10 and the peripheral device 100 respectively and physically attaching both and simultaneously electrically connecting both through the contact by using the contact terminal. Therefore, the mobile device 10 and the peripheral device 100 are used as a single device.

To specifically describe the connection structure of the foregoing constituents, when the connector plug 236 is inserted into the connection port 11 of the mobile device 10 and the lower end of the mobile device 10 is mounted on the lower end of the mount unit 200, that is, to be placed to be aligned to the position of the connector housing 237, the connector plug 236 and the connector housing 237 of the second connector part 235 are physically attached to each other by magnetic force. Due to the attachment by magnetism, the mobile device 10 and the peripheral device 100 are connected to each other through the mount unit 200.

The sled system of the present invention may separately include a charging cradle (not shown) to make it easy to charge externally. As shown in FIG. 2, the mount unit 200 may include a cradle contact part 240 to be connected to the charging cradle. The cradle contact part 240 is connected to the connection circuit board 231 inside, allowing charge current to each of the peripheral device 100 and the mobile device 10. The mount unit 200 includes a mounting groove 241 formed to be adjacent to the cradle contact part 240, enabling to mount the sled system on the charging cradle and therefore to maintain a stable mounting state upon charging.

The operation of the sled system according to the present invention will be described referring to the attached drawings:

The sled system is provided to be used by a user by easily physically attaching the peripheral device 100 to the mobile device 10.

The sled system provides the mount unit 200 and the protection case 300, to attach the mobile device 10 to the peripheral device 100.

According to the embodiment of the present invention, the mount unit 200 comprises the peripheral device attachment part 210 to be attached to the peripheral device 100 and the mobile device attachment part 220 to be attached to the mobile device 10. The peripheral device 100 is attached to the mount unit 200 by the peripheral device attachment part 210, and the mobile device 10 is attached to the peripheral device 100 by securing the protection case 300 protecting the mobile device 10 to the mount unit 200.

The attachment structure between the peripheral device 100 and the mount unit 200 and the attachment structure between the mount unit 200 and the protection case 300 are provided by the screw-fastening method, enabling to firmly hold these constituents. When these constituents need to be dissembled or separated, they are released from being held by simply loosening screws and thus, the attachment and separation work is easily accomplished.

Especially, since the peripheral device 100 is attached to the mount unit 200 which is attached to the protection case 300, if any mobile device fits a general protection case, such a mobile device is attached to the peripheral device 100, without any limitation to a particular mobile device, regardless of the size or shape of the mobile device.

That is, even if a special case which fits a certain mobile device having a different shape is not provided to hold the mobile device, it is possible to attach the mount unit 200 and the peripheral device 100 by only forming, in an ordinary protection case, the through hole to be aligned to the mobile device attachment part 220 of the mount unit 200. In this point, the mobile device 10 is simply held without preparing any holding unit which differently operates according to the different size of the mobile device to be used.

The mount unit 200 comprises the electrical connection part 230 to be electrically connected to the mobile device 10 and the peripheral device 100, allowing a wired connection of the mobile device 10 and the peripheral device 100.

According to the embodiment of the present invention, the first connector part 233 to be connected to the peripheral device 100 uses a simple connection method using electric contacts. The second connector part 235 to be connected to the mobile device 10 includes a connector head part to be connected to the connection port 11 of the mobile device 10 by a magnetic method, regardless of the type of the connection port. In this magnetic connection structure, the connector plug and the connector housing are attachable/detachable by the magnetic force. Therefore, a breaking of the connection cable or connector plug is prevented by insuring no physical interference? between the connector plug and the connector housing when the mobile device 10 is inserted in the protection case 300 secured to the mount unit 200.

In the second connection part 235, the connecting structure using the magnetic method is replaceable. Since it is possible to selectively use any connector plug, regardless of the type of the connection port of the mobile device, the compatibility with the mobile device is considerably improved.

Further, the mount unit 200 comprises the connector housing 237 which is movable up/down to be connected to the connection port 11 which is positioned at a different height based on the appearance size of the mobile device 10, so as to be compatible with the mobile device 10 in a different size or shape. Therefore, even if the position of the connector plug 236 to be inserted into the connection port 11 is different in height, since the connector housing 237 is sufficiently available, the compatibility with the mobile device is considerably improved.

For the power supply (power charge) of the peripheral device 100 and the mobile device 10, the sled system may comprise each module which enables power charge by an external supply through a separate charging cradle, power supply and charge by using an external auxiliary battery, or wireless charge by a wireless charging module, etc. Since the peripheral device 100 and the mobile device 10 are electrically connected by the electrical connection part 230 of the mount unit 200, the sled system has the structural advantage that power is supplied to both of the peripheral device 100 and the mobile device 10 by only a single external connection.

Upon externally charging through the separate charging cradle, it is possible to supply power to both of the peripheral device 100 and the mobile device 10 by only the connection through cradle connection pins of the mount unit 200, without connecting the charging cable to each of the peripheral device 100 and the mobile device 10. It is the same upon using an external auxiliary battery or the wireless charging module.

Figure 8:
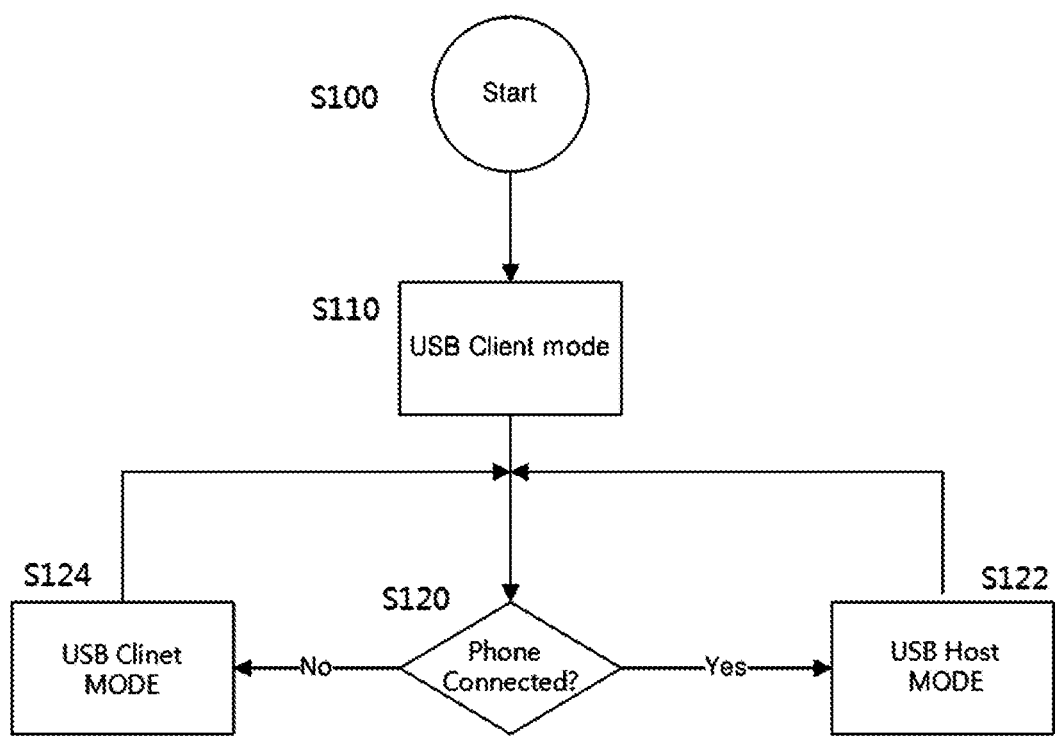
FIG. 8 is a schematic view of an OTG operation of the sled system.

FIG. 8 illustrates the OTG (On-The-Go) operation mode conversion of the control unit provided to the mount unit or the peripheral device in the sled system according to the present invention. As shown in FIG. 8, when power is applied (that is, in step S100 the sled system is turned on), in step S110 the control unit starts in an USB client operation mode. In the USB client operation mode, sled system is connected to an apparatus which operates only in a USB host mode, such as a PC, a laptop computer or a notebook, among others, enabling data communication.

In step S120, the control unit determines whether the Android smart phone 10 is mounted on the sled system. If it is determined that the Android smart hone is connected, in Step S122 the control unit operates the sled system in the USB host mode. If it is determined that the smart phone is not connected in step S120, in step S124 the control unit keeps the operation in the USB client mode.

Figure 9:
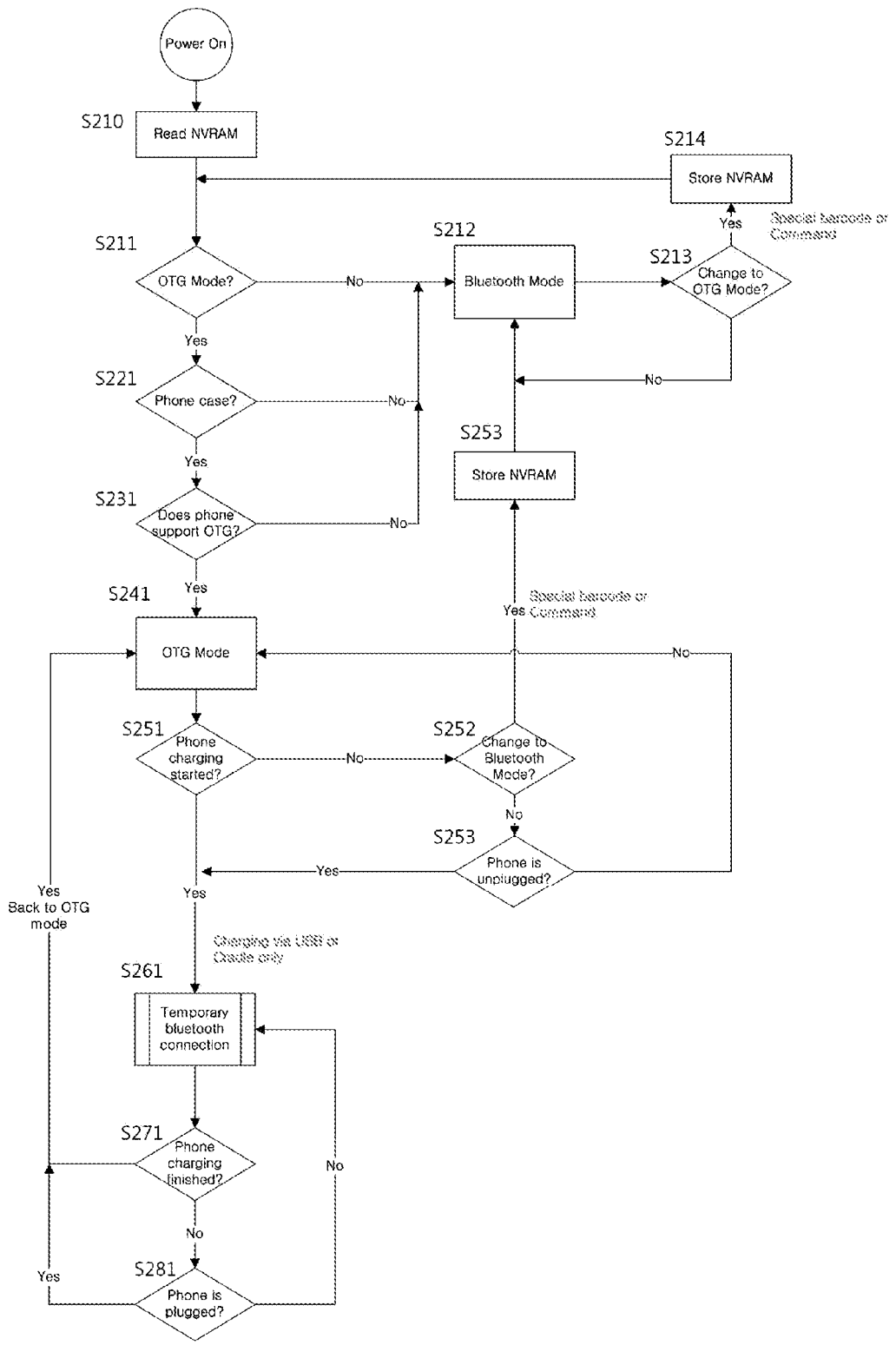
FIG. 9 is a flow chart to illustrate the OTG operation and the charging operation when the mobile device is connected to the sled system.

FIG. 9 is a flow chart to illustrate the communication and charging operations between the control unit of the sled system and the smart phone. As shown in FIG. 9, when power is supplied to the sled system, in S210 the control unit reads system data or booting data stored in nonvolatile memory (NVRAM) included in a circuit. In step S211, after loading the system data, the control unit determines whether the sled system is operating in the OTG mode. If it is determined as the OTG mode in step S211, the control unit goes to step S221. Otherwise, the control unit goes to step S212 and the sled system operates in a Bluetooth communication mode. Then, the control unit keeps the Bluetooth communication mode in step S212 and simultaneously, if a request to change to the OTG mode is input by the user in step S213, the control unit stores the request in the nonvolatile memory in step S214 and goes to step S211. However, if such a request is not input from the user, the control unit returns to step S212 and keeps the Bluetooth communication mode.

If the sled system operates in the OTG mode (USB client mode) in step S211, the control unit determines whether the smart phone is connected to the sled system as in step S221.

If the smart phone is connected to the sled system in step S221, the control unit goes to step S231. However, when the smart phone is not connected to the sled system, the control unit goes to step S212 so that the sled system operates in the Bluetooth communication mode.

In step S231, after the smart phone is connected, whether the smart phone supports the OTG function is determined. When the connected smart phone supports the OTG function in step S231, in step S241 the sled system performs operation in the OTG mode (USB host mode). However, when the connected smart phone does not support the OTG function, the control unit goes to step S212 so that the sled system operates in the Bluetooth communication mode.

In step S241, the OTG mode is performed and in step S251, the control unit determines the charge state of the connected smart phone. When it is necessary to charge the smart phone in step S251, the control unit goes to step S261. Otherwise, the control unit goes to step S252. Since the sled system operates in the USB host mode and the smart phone operates in the USB client mode, charging the smart phone is possible in the state that it is connected to the sled system.

Since the smart phone operates in the USB client mode in step S251, the smart phone is connected to the temporary Bluetooth communication, to perform the communication between the sled system and the smart phone in step S261.

In step S271, whether the charging of the smart phone is completed is determined. When the charging of the smart phone is completed, the control unit returns to step S241 so that the smart phone is changed to the USB host mode. However, when it is determined that the charging of the smart phone is not completed in step S271, the control unit goes to step S281 so that whether the smart phone is still plugged to the sled system is determined. If the smart phone is still plugged to the sled system in step S281, the control unit returns to step S271 so that the smart phone is continuously charged. However, if the smart phone is not plugged in, the control unit returns to step S261.

If charging the smart phone does not start in step S251, the control unit goes to step S252 so that whether to change the OTG mode to the Bluetooth communication mode is determined. When changing to the Bluetooth communication mode is needed in step S252, the control unit goes to step S253 so that the Bluetooth communication mode performs. However, when the change to the Bluetooth communication mode is not needed in step S252, the control unit goes to step S253 so that whether the smart phone is unplugged from the sled system is determined. When the smart phone is unplugged from the sled system, the control unit goes to step S261. When the smart phone is plugged to the sled system, the control unit goes to step S241 for further progresses.

In the present invention, since the smart phone cannot be charged in the OTG mode operating as the USB host, the sled system is changed as the USB host, and the smart phone is changed as the USB client, enabling to charge the smart phone. When the smart phone is in the USB client mode, it is possible to charge the smart phone and to perform the communication with the peripheral device by changing the communication method between the smart phone and the sled system to the Bluetooth communication mode.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A modular sled system for physically attaching a mobile device (10) and a peripheral device (100) and electrically connecting both, comprising:
    a mount unit (200) to physically attach the peripheral device (100) to the mobile device (10), wherein the mount unit (200) comprises an electrical connection part (230) to be electrically connected in use to each of the peripheral device (100) and the mobile device (10),
    wherein the electrical connection part (230) of the mount unit (200) comprises: a connection circuit board (231), a first connector part (233) to be connected to the peripheral device (100) and a second connector part (235) to be connected to the mobile device (10), the first connector part (233) and the second connector part (235) positioned oppositely on the connection circuit board (231) to simultaneously connect the peripheral device (100) and the mobile device (10), respectively,
    wherein the first connector part (233) comprises: a contact terminal to be in contact with the peripheral device (100), the second connector part (233) comprises a connector plug (236) with a connector head to be inserted in a connection port (11) of the mobile device (10) and a connector housing (237) to receive the connector plug (236), the connector plug (236) being attachably/detachably mounted on the connector housing (237) by magnetic force.

2. The modular sled system according to claim 1, wherein the connector housing (237) of the second connector part (235) is mounted on the connection circuit board (231), so as to be movable up/down to the height of the connection port (11) of the mobile phone (10).

3. The modular sled system according to claim 2, wherein the second connector part (235) further comprises a connection cable (238) to be movable in response to the up/down movement of the connector housing (237), to maintain the connection between the connection circuit board (231) and the connector housing (237).

4. The modular sled system according to claim 1, wherein the electrical connection part (230) further comprises a power supply part to supply power from the outside to the peripheral device (100) and the mobile device (10).

5. The modular sled system according to claim 4, wherein the power supply part is selected from a group consisting of a wireless charging module, a charging cradle pin, an auxiliary battery terminal and a USB connection terminal.

6. The modular sled system according to claim 1, wherein the peripheral device (100) is selected from a group consisting of a small bar code reader, a magnetic strip reader (MSR), an integrated circuit (IC) card reader, a peripheral device trigger and a RFID tag reader.

7. The modular sled system according to claim 1, further comprising: a control unit which operates in a USB client mode or a USB host mode when the mobile device is mounted on the modular sled system.

8. The modular sled system according to claim 7, wherein when the mobile device (10) is not mounted on the modular sled system, the control unit operates the modular sled system in the USB client mode and when the mobile device (10) is mounted, the control unit operates the modular sled system in the USB host mode.

9. The modular sled system according to claim 8, wherein when the mobile device (10) is mounted on the modular sled system, the modular sled system operates in the USB host mode and the mobile device (10) operates in the USB client mode, to charge the mobile device (10), and when the mobile device (10) is in the process of being charged, the modular sled system communicates with the mobile device (10) through Bluetooth communication.

10. The modular sled system according to claim 9, wherein when charging the mobile device (10) is completed, the modular sled system is changed to the USB client mode so that the mobile device (10) operates in the USB host mode.

11. A modular sled system for physically attaching a mobile device (10) and a peripheral device (100) and electrically connecting both, comprising:
    a mount unit (200) to physically attach the peripheral device (100) to the mobile device (10), wherein the mount unit (200) comprises an electrical connection part (230) to be electrically connected in use to each of the peripheral device (100) and the mobile device (10), and
    a control unit which operates in a USB client mode or a USB host mode when the mobile device is mounted on the modular sled system,
    wherein when the mobile device (10) is not mounted on the modular sled system, the control unit operates the modular sled system in the USB client mode and when the mobile device (10) is mounted, the control unit operates the modular sled system in the USB host mode.

12. The modular sled system according to claim 11, wherein when the mobile device (10) is mounted on the modular sled system, the modular sled system operates in the USB host mode and the mobile device (10) operates in the USB client mode, to charge the mobile device (10), and when the mobile device (10) is in the process of being charged, the modular sled system communicates with the mobile device (10) through Bluetooth communication.

13. The modular sled system according to claim 12, wherein when charging the mobile device (10) is completed, the modular sled system is changed to the USB client mode so that the mobile device (10) operates in the USB host mode.

* * * * *